(12) United States Patent
Xing

(10) Patent No.: US 11,006,518 B2
(45) Date of Patent: May 11, 2021

(54) PANEL DRIVING STRUCTURE, FLIP-CHIP FLEXIBLE FILM FOR DRIVING A PANEL, AND REINFORCEMENT METHOD FOR FLIP-CHIP FLEXIBLE FILM

(71) Applicant: Wuhan China Star Optoelectronics Technology Co., Ltd., Wuhan (CN)

(72) Inventor: Zhenzhou Xing, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 393 days.

(21) Appl. No.: 16/097,620

(22) PCT Filed: Sep. 12, 2018

(86) PCT No.: PCT/CN2018/105337
§ 371 (c)(1),
(2) Date: Oct. 30, 2018

(87) PCT Pub. No.: WO2019/205430
PCT Pub. Date: Oct. 31, 2019

(65) Prior Publication Data
US 2021/0100093 A1    Apr. 1, 2021

(30) Foreign Application Priority Data
Apr. 24, 2018   (CN) .......................... 201810373562.9

(51) Int. Cl.
*H05K 1/00* (2006.01)
*H05K 1/02* (2006.01)
(Continued)

(52) U.S. Cl.
CPC ....... *H05K 1/0281* (2013.01); *G02F 1/13306* (2013.01); *G02F 1/13452* (2013.01);
(Continued)

(58) Field of Classification Search
CPC ................... H05K 1/0281; H05K 3/22; H05K 2201/10674; G02F 1/13452; G02F 1/13306; H01L 27/3276
See application file for complete search history.

(56) References Cited

U.S. PATENT DOCUMENTS

| 2001/0035930 A1* | 11/2001 | Yun ..................... G02F 1/13452 349/149 |
| 2015/0173171 A1 | 6/2015 | Kim |
| 2019/0036075 A1* | 1/2019 | Jiang .................. H01L 51/5253 |

FOREIGN PATENT DOCUMENTS

| CN | 102890348 A | 1/2013 |
| CN | 105163484 | * 12/2015 |

(Continued)

*Primary Examiner* — Yuriy Semenenko
(74) *Attorney, Agent, or Firm* — Leong C. Lei

(57) ABSTRACT

A panel driving structure, a flip-chip flexible film for driving a panel, and a reinforcement method for flip-chip flexible film are provided. The panel driving structure includes a flip-chip flexible film, a panel, and a main circuit board; wherein one end of the flip-chip flexible film is connected to the panel, and the other end of the flip-chip flexible film is connected to the main circuit board through a connector; and wherein the flip chip flexible film is provided with a reinforcement structure for increasing a carrying capacity. The present invention can improve the production efficiency and yield, and reducing the cost at the same time. Combining the flip-chip flexible film with the FPC, a reinforcement thickness and a reinforcement area of the flip-chip flexible film can be adjusted during the manufacturing process, which is adapt to the requirement of a variety of products.

7 Claims, 3 Drawing Sheets

Adhesive coating   Pre-press-folding   Press-folding   Forming   Pressing

(51) Int. Cl.
    *G02F 1/133*     (2006.01)
    *H05K 3/22*     (2006.01)
    *H01L 27/32*     (2006.01)
    *G02F 1/1345*     (2006.01)

(52) U.S. Cl.
    CPC ........... *H01L 27/3276* (2013.01); *H05K 3/22* (2013.01); *H05K 2201/10674* (2013.01)

(56) References Cited

FOREIGN PATENT DOCUMENTS

| | | | |
|---|---|---|---|
| CN | 105163484 A | | 12/2015 |
| CN | 106847871 | * | 6/2017 |
| CN | 106847871 A | | 6/2017 |
| CN | 106898264 A | | 6/2017 |
| CN | 107507513 A | | 12/2017 |
| CN | 107644593 A | | 1/2018 |

* cited by examiner

PANEL DRIVING STRUCTURE, FLIP-CHIP FLEXIBLE FILM FOR DRIVING A PANEL, AND REINFORCEMENT METHOD FOR FLIP-CHIP FLEXIBLE FILM

FIELD OF THE INVENTION

The present invention relates to a display technology field, and more particularly to a panel driving structure, a flip-chip flexible film for driving a panel, and a reinforcement method for flip-chip flexible film.

BACKGROUND OF THE INVENTION

The Liquid Crystal Display (LCD) has many advantages such as a thin body, power saving, and no radiation, and has been widely applied in many products such as: LCD TVs, smart phones, digital cameras, tablet PCs, computer screens, or laptops Screens, etc., so that the LCD dominates the field of flat panel display.

With the development of modern display technology, a narrower frame of the panel and the diversification of the panel shape are becoming more and more common. Therefore, a flip-chip flexible film driving structure (that is, COF, Chip on flexible printed circuit) is applied. The flip-chip flexible film structure is similar to a flexible printed circuit (FPC) of a single-layer board, and is a layer of base film polyimide (PI) plus a layer of copper. The difference between the two is that the adhesive material at the junction location, and the two covering films (coverlay) for the insulation of both layers, the structure difference of the two is at least two layers of adhesive materials so the FPC's flexibility is far worse than the flip-chip flexible film.

FIG. 1 is a schematic diagram of a driving structure of a flip-chip flexible film of a conventional liquid crystal panel. Usually, one end of the flip-chip flexible film 1 is connected to the liquid crystal panel 2, and the other end is connected with the FPC 3. A control signal on the FPC 3 is transferred to the liquid crystal panel 2 through a circuit on the flip-chip flexible film; a driving chip 4 (Driving IC) is arranged on the flip-chip flexible film 1. The FPC 3 is provided with electronic components 5 such as resistors, capacitors, etc., and a connector 6. However, the flip-chip flexible film driving structure also has the disadvantage. The flip-chip flexible film 1 is connected with the FPC 3, and two processes of the flip chip flexible film 1 and the FPC 3 are required in the process, and two bonding processes are required. As a result, the risk of defective products will increase; two processes and two laminating processes will inevitably reduce the production efficiency. In addition, the fail rate and the cost will increase significantly.

SUMMARY OF THE INVENTION

Therefore, an object of the present invention is to provide a panel driving structure and a flip-chip flexible film for driving a panel to improve the current flip-chip flexible film driving structure of small-to-medium-size panel.

Another objective of the present invention is to provide a reinforcement method for a flip-chip flexible thin film and to reinforce a flip-chip flexible film to improve the driving structure of a conventional flip-chip flexible film of small-to-medium-size panel.

In order to achieve the above purpose, the present invention provides a panel driving structure, comprising: a flip-chip flexible film, a panel, and a main circuit board; wherein one end of the flip-chip flexible film is connected to the panel, and the other end of the flip-chip flexible film is connected to the main circuit board through a connector; and wherein the flip chip flexible film is provided with a reinforcement structure for increasing a carrying capacity.

Wherein the reinforcement structure is disposed in a region of the flip-chip flexible film to be reinforced to thicken the region to be reinforced or form a multilayered structure in the region to be reinforced.

Wherein the panel is a liquid crystal panel or an OLED panel.

Wherein the reinforcement structure is a reinforcement structure formed by a carrier tape being folded and fixed to the region to be reinforced.

Wherein the region to be reinforced is disposed below the driving chip, the electronic component and/or the connector which is disposed on a top surface of the flip-chip flexible film, and an area of the region to be reinforced is equal to or greater than an area of the driving chip, the electronic component and/or the connector.

The present invention also provides a flip-chip flexible film for driving a panel, comprising: a first end connected to a panel; a second end connected to a main circuit board through a connector; and a reinforcement structure for increasing a carrying capacity of the flip-chip flexible film.

Wherein the reinforcement structure is disposed in a region of the flip-chip flexible film to be reinforced to thicken the region to be reinforced or form a multilayered structure in the region to be reinforced.

Wherein the reinforcement structure is a reinforcement structure formed by a carrier tape being folded and fixed to the region to be reinforced.

Wherein the region to be reinforced is disposed below the driving chip, the electronic component and/or the connector which is disposed on a top surface of the flip-chip flexible film, and an area of the region to be reinforced is equal to or greater than an area of the driving chip, the electronic component and/or the connector.

The present invention also provides a reinforcement method for a flip-chip flexible film, comprising steps of: moving a flip chip flexible film substrate from a left roller to a right roller, after a press-folding region reaches a designated position, coating an adhesive material at two sides of the press-folding region; pressing the press-folding region, and positioning a bending portion such that the press-folding region is initially bent, at the same time, the left roller is moved to a right side; moving the left roller to the right side, and a pressure between the left roller and the right roller bends the press-folding region to form a reinforcement material; continuously moving the flip-chip flexible film substrate to right, after the flip-chip flexible film substrate is pressed by top and the bottom rollers at the right side, the reinforcement material and a region of the flip-chip flexible film to be reinforced are laminated, and the left roller is reset at the same time; pressing and fitting the region of the flip-chip flexible film to be reinforced.

Wherein through adjusting the area of the press-fitting region and the number of press-fitting to realize different areas of the reinforcement region.

In summary, the panel driving structure of the present invention, the flip chip flexible film used for driving the panel, and the flip-chip flexible film reinforcement method of the present invention can improve the existing flip-chip flexible film driving structure of small and medium-sized panel; reduce the FPC process and integrate the FPC with the manufacturing process of the flip-chip flexible film, which is conducive to improve the production efficiency and yield, and reducing the cost at the same time. Combining the flip-chip flexible film with the FPC, a reinforcement thickness and a reinforcement area of the flip-chip flexible film can be adjusted during the manufacturing process, which is adapt to the requirement of a variety of products.

BRIEF DESCRIPTION OF THE DRAWINGS

The technical solutions and other beneficial effects of the present invention will be apparent from the following detailed description of specific embodiments of the present invention with reference to the accompanying drawings.

in the drawings.

DETAILED DESCRIPTION OF PREFERRED EMBODIMENTS

Figure 1:
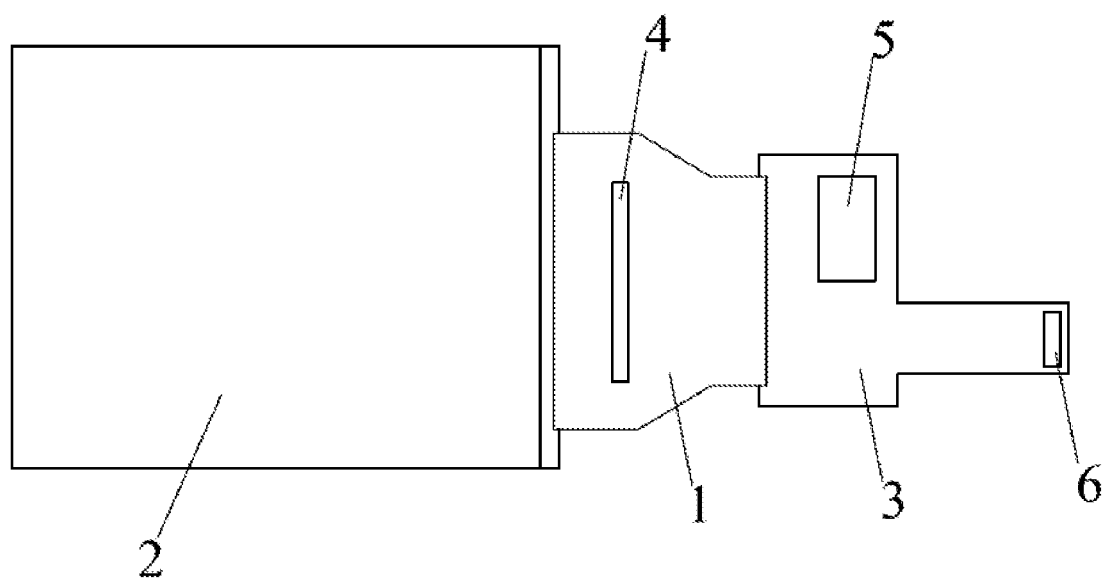
FIG. 1 is a schematic diagram of a driving structure of a flip-chip flexible film of a conventional small-size panel.
Figure 2:
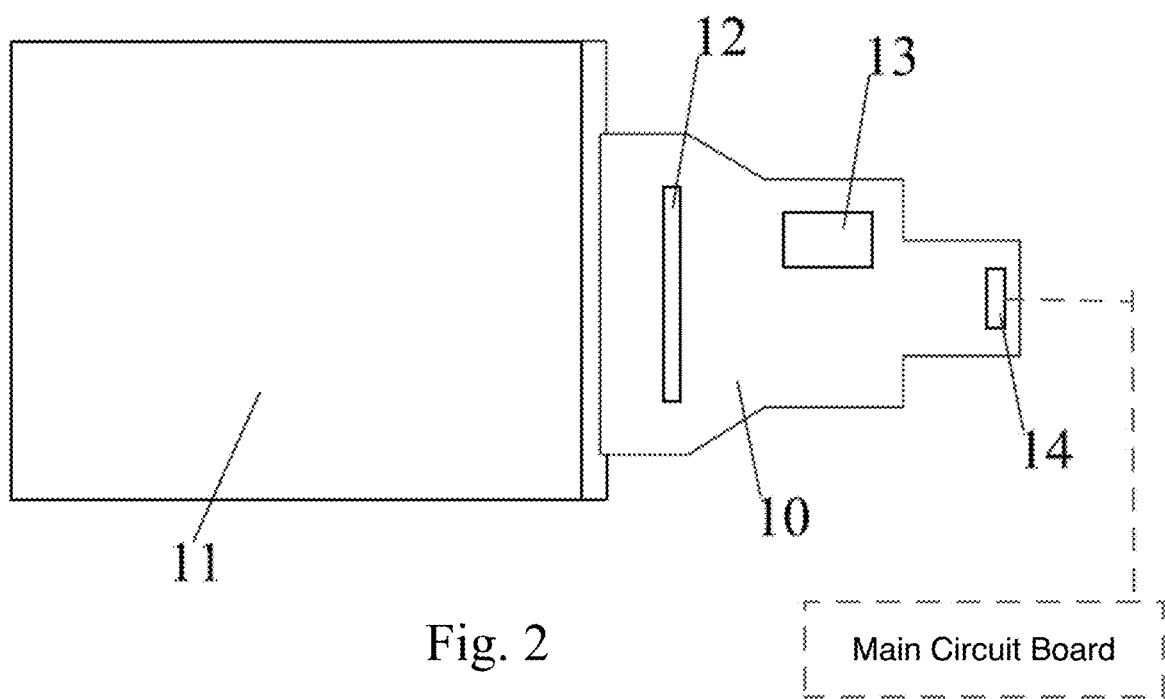
FIG. 2 is a schematic diagram of a preferred embodiment of a panel driving structure according to the present invention.

FIG. 2 is a schematic diagram of a preferred embodiment of a panel driving structure according to the present invention. The present invention provides a novel panel driving structure, which mainly includes a flip-chip flexible film 10, a panel 11, and a main circuit board. One end of the flip-chip flexible film 10 is connected to the panel 11, and the other end of the flip-chip flexible film 10 is connected to the main circuit board through a connector 14. A control signal is transmitted to the panel 11 through a circuit of the flip-chip flexible film 10; the flip chip flexible film 10 is provided with a reinforcement structure for increasing a carrying capacity. The flip-chip flexible film 10 is provided with a driving chip 12 and an electronic component 13 such as a resistor, a capacitor, or the like, and the connector 14.

The reinforcement structure is disposed in a region of the flip-chip flexible film 10 to be reinforced to thicken the region to be reinforced or form a multilayered structure in the region to be reinforced; the location and the area of the region to be reinforced may be determined according to the driving chip 12, the electronic component 13, or the connector 14 disposed on an top surface of the flip-chip flexible film 10. The region to be reinforced can locate below the driving chip 12, the electronic component 13, and/or the connector 14. Or, the region to be reinforced can locate at a continuous region below one terminal and the other terminal of the flip-chip flexible film 10. The size of the region to be reinforced may be equal to or greater than the size of the area of a region occupied by the corresponding driving chip 12, the electronic component 13 and/or the connector 14; the region to be reinforced is preferably located below the electronic component 13, and the size of the region to be reinforced may be equal to or greater than the size of the electronic component 13 on the top surface of the flip-chip flexible film 10.

The present invention combines the Flexible Printed Circuit (FPC) with the flip-chip flexible film, and transfers the function of the FPC for carrying the components onto the flip-chip flexible film so that the present invention replaces the FPC process with the flip-chip flexible film. Due to the insufficient carrying capacity of the flip-chip flexible film, a reinforcement portion should be added on the flip-chip flexible film to increase the ability to carry components. The reinforcement structure may be a reinforcement structure formed by the carrier tape being folded and fixed to the region to be reinforced, or a reinforcement structure formed by a reinforcement material attached to the region to be reinforced. For a specific reinforcement structure and a reinforcement method, referring to the embodiment of the method for reinforcing a flip-chip flexible film of the present invention provided below.

With reference to FIG. 2, an embodiment of the present invention further provides a flip-chip flexible film for driving a panel, which can be applied to the panel driving structure of the present invention. The flip-chip flexible film mainly includes: a first end for connecting a panel; a second end for connecting with a main circuit board through a connector, and the control signal is transmitted to the panel through the circuit of the flip-chip flexible film; a reinforcement structure (not shown) for increasing the carrying capacity of the flip-chip flexible film. The reinforcement structure may be a reinforcement structure formed by laminating after being affixed by a carrier tape, or a reinforcement structure formed by laminating after being affixed by a reinforcement material. The flip-chip flexible film can also be provided with a driving chip, an electronic component, and a connector. The flip-chip flexible film of the present invention combines the FPC with the flip-chip flexible film to transfer the function of the FPC for carrying component onto the flip-chip flexible film, and replaces the FPC process with the flip-chip flexible film.

Due to the insufficient carrying capacity of the flip-chip flexible film, a reinforcement portion should add on the flip-chip flexible film so as to increase the capability for carrying the component. The present invention also provides a reinforcement method for increasing carrying capacity of the flip-chip flexible film. The invention provides a reinforcement method for directly reinforcing the carrying capacity of a flip-chip flexible film and a reinforcement method for partially reinforcing the flip-chip flexible film using the carrier tape of the flip-chip flexible film.

Figure 3:
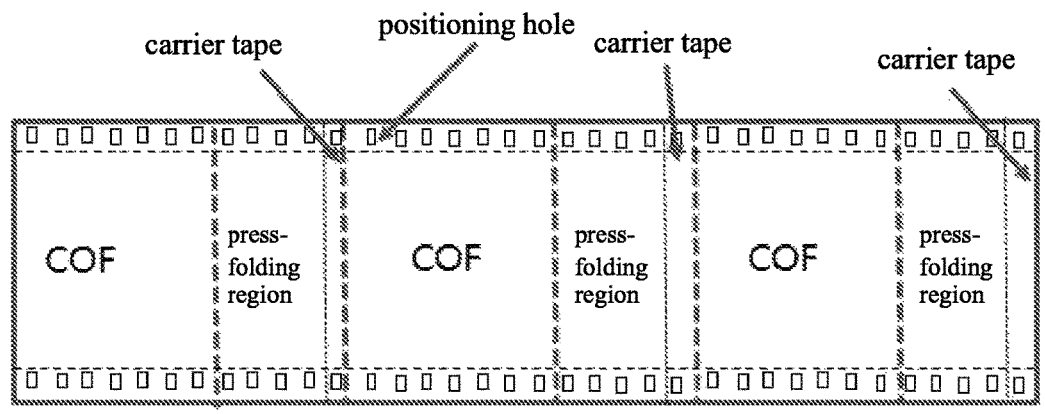
FIG. 3 is a schematic diagram of a flip-chip flexible film substrate.

With reference to FIG. 3, which a schematic diagram of a flip-chip flexible film substrate. The flip-chip flexible film substrate mainly includes a flip-chip flexible film and a carrier tape. An edge of the flip-chip flexible film substrate is provided with a positioning hole, and a portion of the carrier tape can be set as a folding region. In a preferred embodiment of the present invention, the method using the carrier tape of the flip-chip flexible film substrate to partially reinforce the flip-chip flexible film to partially fold the carrier tape in order to replace the reinforcement material and being fixed to a region of the flip-chip flexible film to be reinforced in order to increase the carrying ability of the flip-chip flexible film. Besides, the folding portion and the folding thickness can be adjusted to meet the requirements of various products. When the folding and reinforcing, the position of the positioning hole is necessary to pay attention, and the positioning holes after folding need to correspond one by one.

Figure 4:
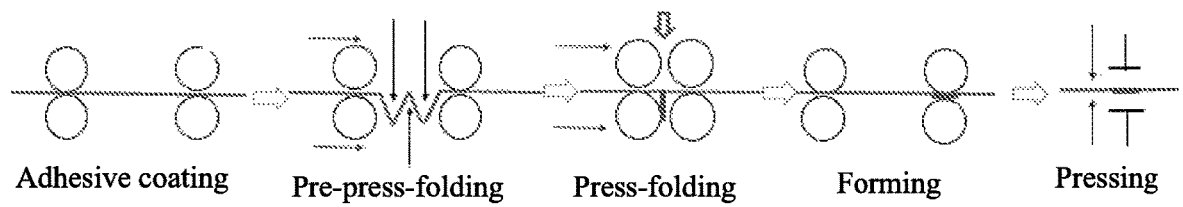
FIG. 4 is a schematic flow chart of reinforcement method for a flip-chip flexible film according to a preferred embodiment of the present invention.

With referring to FIG. 4, which is a flow chart of a preferred embodiment of a reinforcement method for a flip-chip flexible film according to the present invention. The preferred embodiment uses the carrier tape of the flip-chip flexible film substrate to partially reinforce the flip-chip flexible film, and the equipment used may include: a group of rollers is provided on each of the left and right sides, and the two group of rollers are relatively movable; each group of rollers includes two rollers positioned above and below, and the distance between the two rollers is adjustable. The equipment further includes a press-folding device and the press-fitting device.

The process is as follows:

Preparation stage: after a press-folding region reaches a designated position, coating an adhesive material at two sides of the press-folding region;

Pre-press-folding stage: using the press-folding device, pressing the press-folding region, and positioning a bending portion such that the press-folding region is initially bent, at the same time, the left roller is moved to the right;

Press-folding stage: the left roller is moved to the right side, and a pressure between the left roller and the right roller bends the press-folding region to form a reinforcement material;

Forming stage: the flip-chip flexible film substrate continues to move to the right, after the flip-chip flexible film substrate is pressed by the top and the bottom rollers at the right side, the reinforcement material and a region of the flip-chip flexible film to be reinforced are laminated, and the left roller is reset at the same time;

Pressing stage: using a press-fitting device to press and fit the region of the flip-chip flexible film to be reinforced.

When different areas of the reinforcement region are required, only the area of the press-fitting region and the number of press-fitting need to be adjusted.

Figure 5:
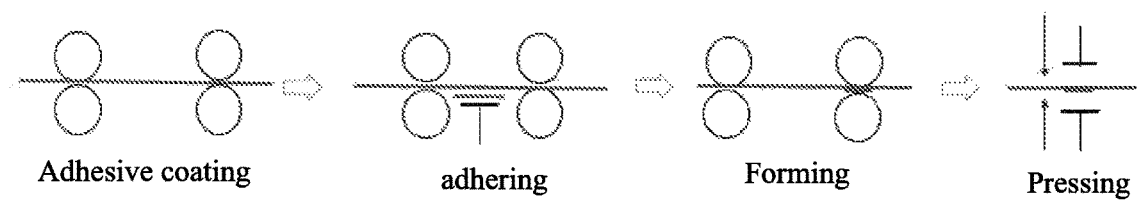
FIG. 5 is a schematic flow chart of reinforcement method for a flip-chip flexible film according to another preferred embodiment of the present invention.

FIG. 5 is a schematic flow chart of a reinforcement method for a flip-chip flexible film according to another preferred embodiment of the present invention. The present embodiment directly reinforces the flip-chip flexible film through adhering a reinforcement material to a carrier tape region. The device can include a group of rollers is provided on each of the left and right sides; each group of rollers includes two rollers positioned above and below, and the distance between the two rollers is adjustable. The equipment further includes a press-fitting device.

The process is as follows:

Preparation stage: after a press-folding region reaches a designated position, coating an adhesive material at the press-folding region;

Adhering stage: adhering the reinforcement material to the designated position;

Forming stage: an adhesive region is moved to a location between right rollers and after passing through the right rollers, the reinforcement material and the region of the flip-chip flexible film to be reinforced are adhered;

Pressing stage: using the press-fitting device to press and fit the region of the flip-chip flexible film to be reinforced;

When different areas of the reinforcement region are required, only the area of the press-fitting region and the number of press-fitting need to be adjusted.

In summary, the panel driving structure of the present invention, the flip chip flexible film used for driving the panel, and the flip-chip flexible film reinforcement method of the present invention can improve the existing flip-chip flexible film driving structure of small and medium-sized panel; reduce the FPC process and integrate the FPC with the manufacturing process of the flip-chip flexible film, which is conducive to improve the production efficiency and yield, and reducing the cost at the same time. Combining the flip-chip flexible film with the FPC, a reinforcement thickness and a reinforcement area of the flip-chip flexible film can be adjusted during the manufacturing process, which is adapt to the requirement of a variety of products.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. A panel driving structure, comprising:
   a flip-chip flexible film, a panel, and a main circuit board;
   wherein one end of the flip-chip flexible film is connected to the panel, and the other end of the flip-chip flexible film is connected to the main circuit board through a connector; and
   wherein the flip chip flexible film is provided with a reinforcement structure for increasing a carrying capacity;
   wherein the reinforcement structure comprises a multifold structure including multiple consecutive segments of a portion of the flip-chip flexible film that are folded and fixed together to form the multifold structure and the multifold structure is fixed to a surface of an adjacent portion of the flip-chip flexible film.

2. The panel driving structure according to claim 1, wherein the reinforcement structure is disposed in a region of the flip-chip flexible film to be reinforced to form a multilayered structure in the region to be reinforced.

3. The panel driving structure according to claim 2, wherein the region to be reinforced is disposed below at least one of the driving chip, the electronic component and the connector which are disposed on a top surface of the flip-chip flexible film, and an area of the region to be reinforced is equal to or greater than an area of the at least one of the driving chip, the electronic component and the connector.

4. A flip-chip flexible film for driving a panel, comprising:
   a first end connected to a panel;
   a second end connected to a main circuit board through a connector; and
   a reinforcement structure for increasing a carrying capacity of the flip-chip flexible film;
   wherein the reinforcement structure comprises a multifold structure including multiple consecutive segments of a portion of the flip-chip flexible film that are folded and fixed together to form the multifold structure and the multifold structure is fixed to a surface of an adjacent portion of the flip-chip flexible film.

5. The flip-chip flexible film for driving a panel according to claim 4, wherein the reinforcement structure is disposed in a region of the flip-chip flexible film to be reinforced to form a multilayered structure in the region to be reinforced.

6. The flip-chip flexible film for driving a panel according to claim 5, wherein the region to be reinforced is disposed below at least one of the driving chip, the electronic component and the connector which are disposed on a top surface of the flip-chip flexible film, and an area of the region to be reinforced is equal to or greater than an area of the at least one of the driving chip, the electronic component and the connector.

7. A reinforcement method for a flip-chip flexible film, comprising steps of:
   moving a flip-chip flexible film substrate from a left roller to a right roller, such that a press-folding region of the flip-chip flexible film substrate reaches a designated position, where an adhesive material is coated on two sides of the press-folding region of the flip-chip flexible film substrate;

pressing the press-folding region and positioning a bending portion such that the press-folding region is initially bent to form a corrugated structure including successive segments of the press-folding region of the flip-chip flexible film substrate, while the left roller is being moved to a right side;

moving the left roller to the right side, such that a pressure is induced between the left roller and the right roller to further bend the corrugated structure of the initially-bent press-folding region to form a reinforcement material that is of a multifold structure;

continuously moving the flip-chip flexible film substrate toward the right side, such that the flip-chip flexible film substrate passes through the right roller and the multifold structure of the reinforcement material is pressed toward the flip-chip flexible film structure by top and the bottom rolling elements of the right roller to have the multifold structure of the reinforcement material and a region of the flip-chip flexible film to be reinforced laminated together, and the left roller is reset at the same time; and pressing and fitting the region of the flip-chip flexible film to be reinforced, wherein the multifold structure comprises multiple consecutive segments of a portion of the flip-chip flexible film substrate that are folded and fixed together to form the multifold structure and the multifold structure is fixed to a surface of an adjacent portion of the flip-chip flexible film.

* * * * *